(12) United States Patent
Hasebe et al.

(10) Patent No.: US 6,228,561 B1
(45) Date of Patent: *May 8, 2001

(54) FILM FORMING METHOD AND FILM FORMING APPARATUS

(75) Inventors: Keizo Hasebe; Shuuichi Nishikido, both of Kofu; Nobuo Konishi; Takayuki Toshima, both of Yamanashi-ken; Kazutoshi Yoshioka, Kumamoto-ken, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/791,618

(22) Filed: Jan. 31, 1997

(30) Foreign Application Priority Data

Feb. 1, 1996 (JP) .................................................... 8-039026
Feb. 5, 1996 (JP) .................................................... 8-042079

(51) Int. Cl.[7] .................................................... G03F 7/16
(52) U.S. Cl. .................... 430/311; 430/327; 430/330; 427/240; 427/425
(58) Field of Search .................................... 430/269, 270, 430/330, 327, 311; 427/240, 425

(56) References Cited

U.S. PATENT DOCUMENTS

| 4,347,302 | * | 8/1982 | Gotman | 430/270 |
| 5,658,615 | * | 8/1997 | Hasebe | 427/240 |
| 5,695,817 | * | 12/1997 | Tateyama | 427/240 |

FOREIGN PATENT DOCUMENTS 63-133526   6/1988   (JP) .

* cited by examiner

Primary Examiner—Kathleen Duda
(74) Attorney, Agent, or Firm—Oblon, Spivak, McClelland, Maier & Neustadt, P.C.

(57) ABSTRACT

A solvent of a resist solution is dropped from a solvent supply nozzle onto the surface of a semiconductor wafer held by a spin chuck. The semiconductor wafer is rotated by the spin chuck to spread the resist solution over the entire surface of the semiconductor wafer W. Simultaneously, the resist solution is dropped from a resist solution supply nozzle onto the semiconductor wafer and spread following the solvent. During the processing, the processing space is isolated from the outer atmosphere by closing a lid of a processing vessel and a sprayed solvent is supplied into the processing space. The processing space is thus filled with the mist of solvent. In the processing space supplied with the solvent, evaporation of the solvent from the resist solution is suppressed. A film of the resist solution is formed with a uniform film thickness to the edge of the semiconductor wafer W.

17 Claims, 13 Drawing Sheets

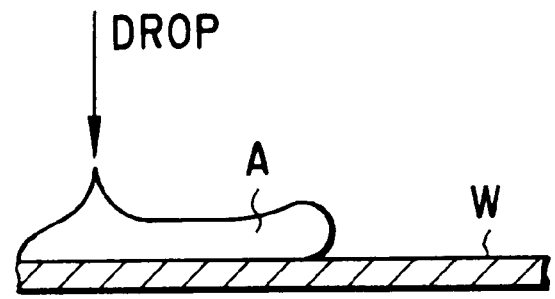
F I G. 1A
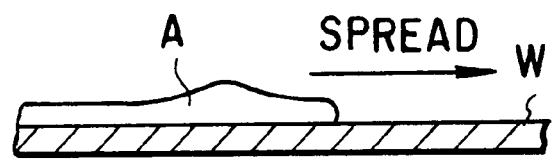
F I G. 1B
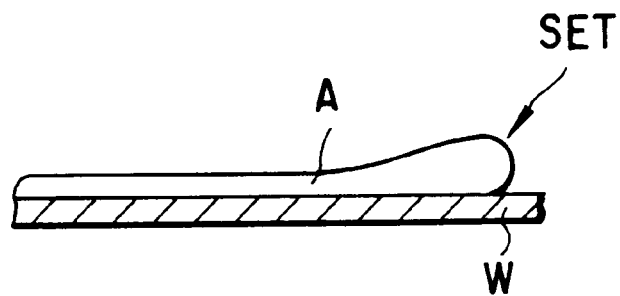
F I G. 1C

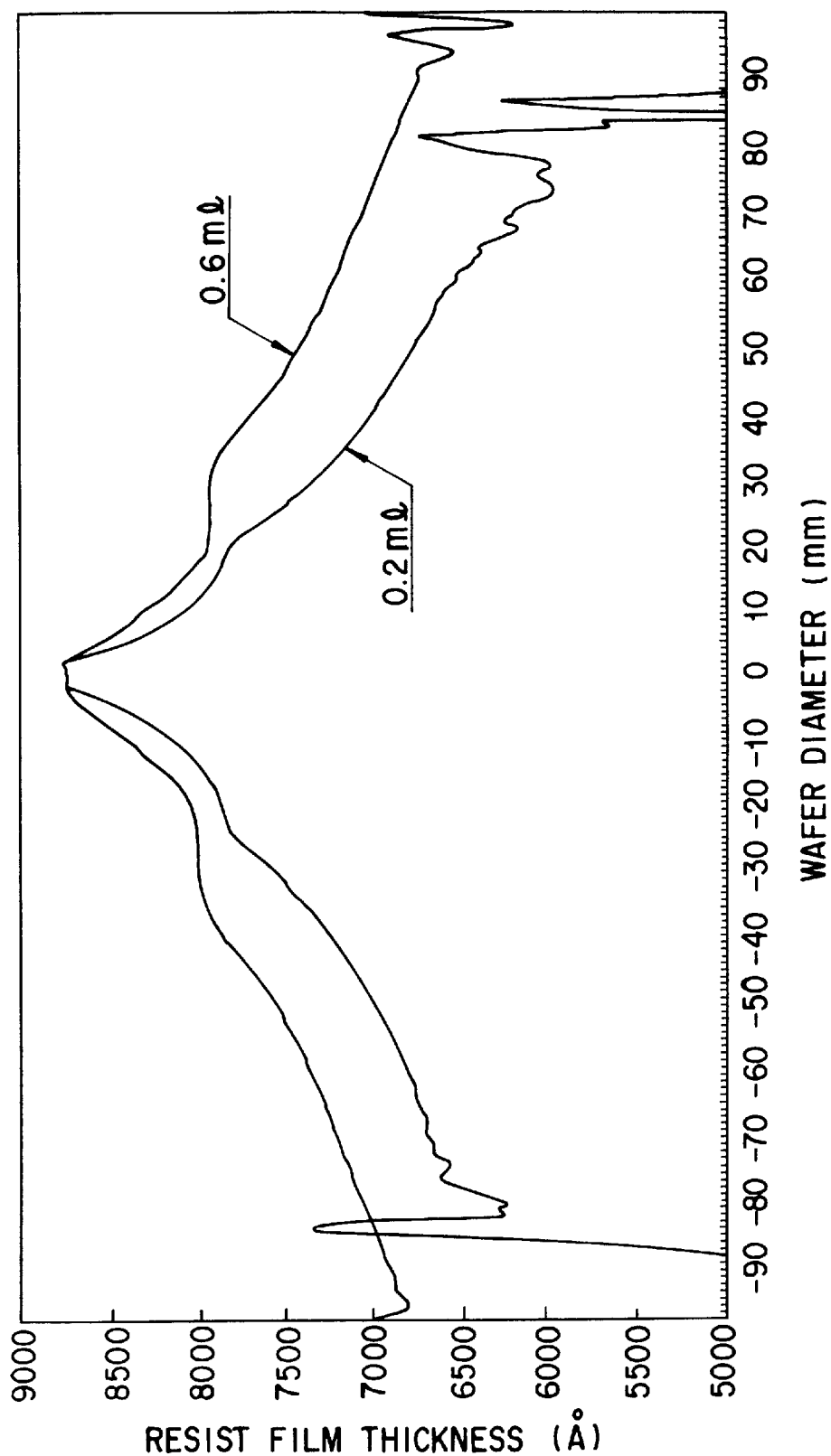
F I G. 5

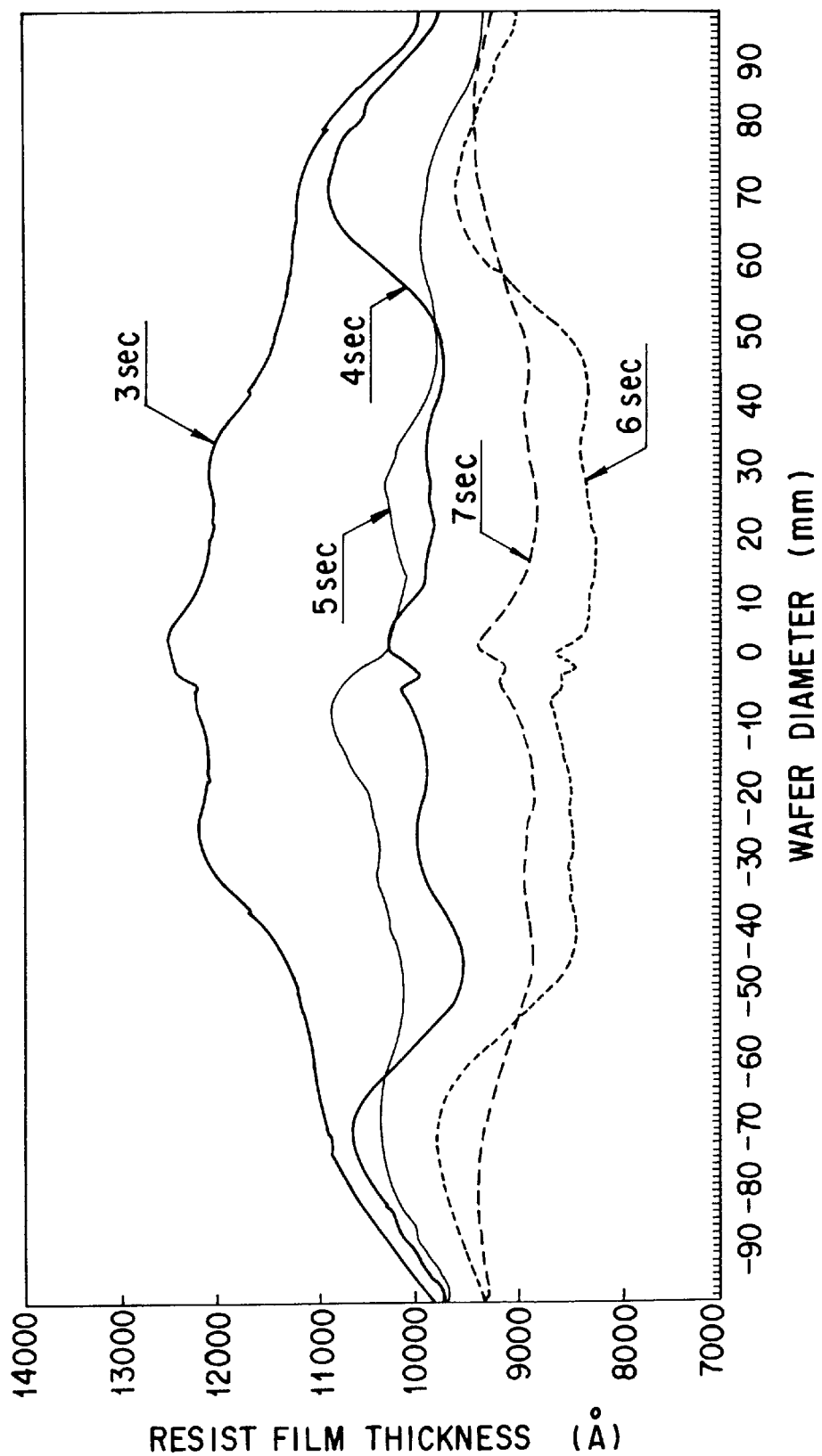
F I G. 6

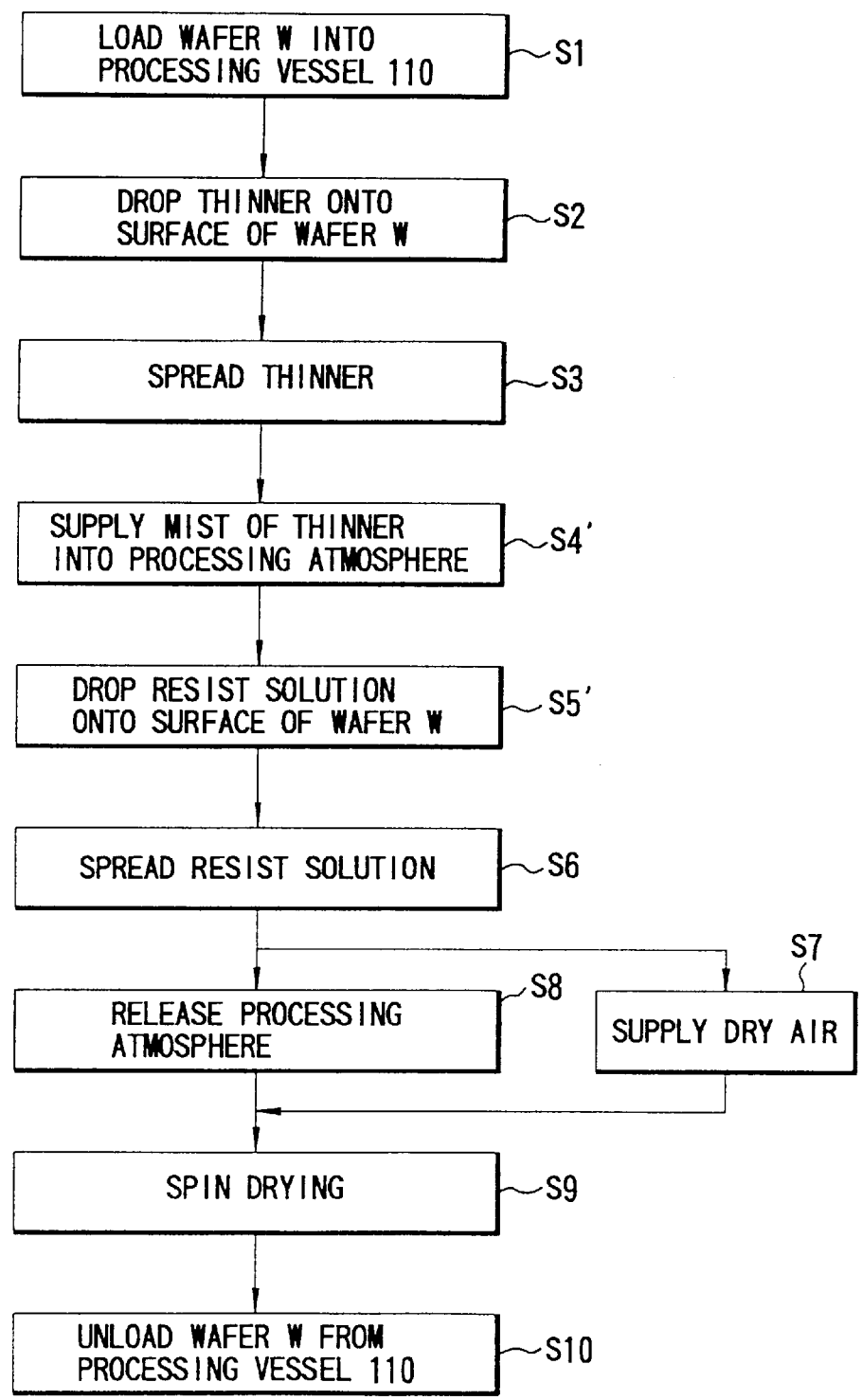
F I G. 7

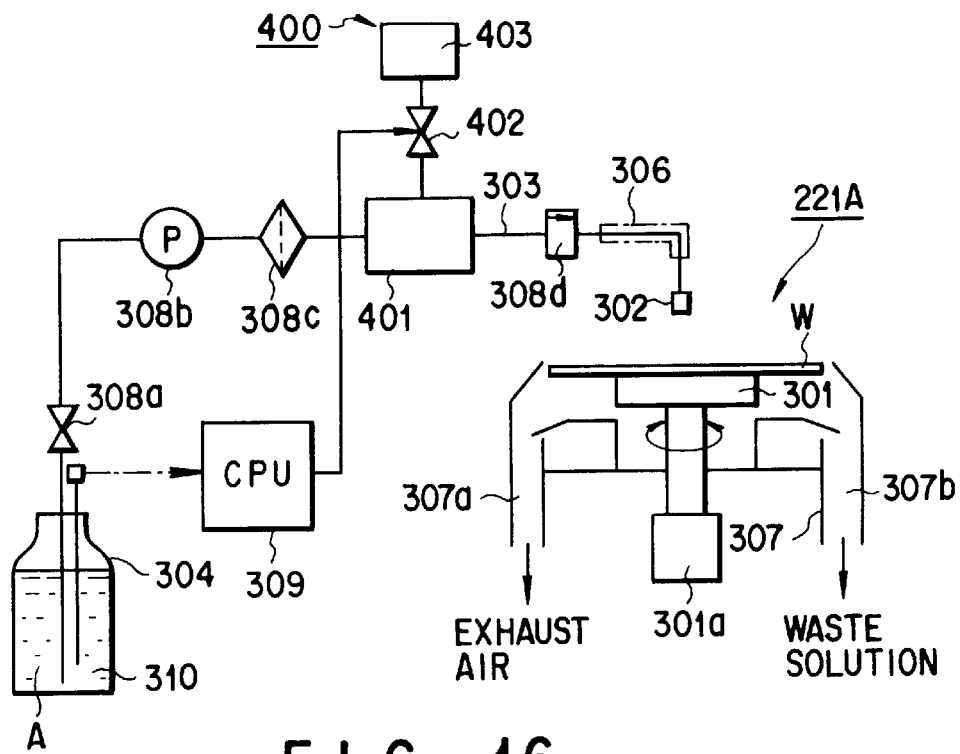
F I G. 16
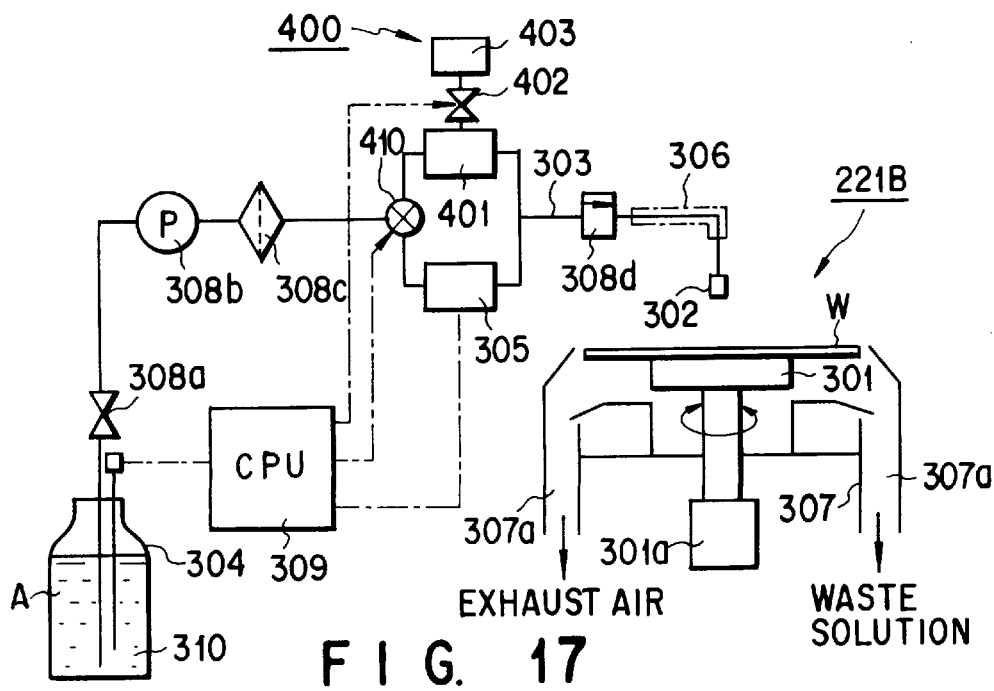
F I G. 17

FILM FORMING METHOD AND FILM FORMING APPARATUS

BACKGROUND OF THE INVENTION

The present invention relates to a film forming method and a film forming apparatus used in a semiconductor fabrication process.

A semiconductor device fabrication process includes a photolithography step of performing resist coating, exposure, and development for an object to be processed, e.g., a semiconductor wafer (to be referred to as a wafer hereinafter) such as a silicon substrate. More specifically, a wafer is coated with a coating solution such as a photoresist solution to form a photoresist film. The photoresist film is exposed by projecting a pattern such as a circuit in a reduced scale by using a photographic technology, and the exposed photoresist film is developed.

The above photolithography step is crucial in increasing the packing density of semiconductor devices. To evenly form a resist film on the surface of a wafer in this photolithography step, a solvent of a resist solution is dropped on the surface of the wafer before coating of the resist solution and spread on the wafer surface by rotating the wafer. Thereafter, the resist solution is dropped on the surface of the rotating wafer, thereby spreading out the resist solution by making the resist solution follow the solvent. This method is disclosed in Jpn. Pat. Appln. KOKAI Publication Nos. 61-91655, 61-150332, and 7-320999.

In the conventional coating film forming methods of the above sort, however, a certain volume of a resist solution A must be supplied, as shown in FIG. 1A, to make the resist solution cover the edge of a wafer. Therefore, as shown in FIGS. 1A to 1C, it is possible that the end portion of the resist solution A sets before the resist solution A covers the edge of a wafer W. Consequently, not only the film thickness becomes nonuniform but the amount of resist solution cannot be decreased.

To avoid the setting of the end portion of the resist solution A, the rotating speed of a wafer can be increased. However, if the wafer W is rotated at a high speed, the peripheral speed of the outermost periphery of the wafer W increases. When the peripheral speed exceeds a certain speed, evaporation of a solvent such as a thinner in the resist solution A is disturbed by turbulence of an airstream above the perimeter of the wafer W, as a parameter other than the moment by which the resist solution A spreads using a centrifugal force. This results in vertical stripes on the edge of the wafer W. As a consequence, even coating of the resist solution A becomes difficult. To remove the unevenness on the edge of the wafer W, the use amount of resist solution must be increased.

In particular, since 8" and 12" wafers are presently used as the packing density of semiconductor devices is increased, it is necessary to decrease the rotating speed of a wafer compared to that of a 6" wafer. This increases the use amount of resist solution and makes a uniform resist film thickness difficult to obtain.

As a method of forming a resist film on the surface of a wafer in the photolithography step, a spin coating method is known in which a resist solution is dropped on the surface of a wafer so held as to be horizontally rotatable by a spin chuck and the wafer is rotated to coat the wafer surface with the resist solution. When a resist solution having a predetermined viscosity is used in this coating method, the film thickness of the resist film can be changed by changing the rotating speed of a wafer. That is, the film thickness can be decreased by increasing the wafer rotating speed and increased by decreasing the rotating speed.

With the recent increase in the packing density of semiconductor devices, conventional 6" wafers tend to be replaced with large-diameter wafers such as 8" and 12" wafers, and a similar coating method is also used for these large-diameter wafers.

Unfortunately, when such a large-diameter wafer is rotated at a high speed, turbulent air is produced above the edge of the wafer as described above, and this makes a resist film uneven on the edge of the wafer. To form a resist film on a large-diameter wafer, therefore, a resist solution with a low viscosity must be used. Also, to form resist films differing in film thickness, it is necessary to prepare a plurality of different types of resist solutions of each different viscosity and perform coating by changing the resist solutions each time the types of resist films to be formed are changed. Consequently, the productivity decreases in this method of performing coating while changing different types of resist solutions differing in viscosity. Additionally, the maintenance of these resist solutions is troublesome and the storage space of the solutions needs to be secured.

BRIEF SUMMARY OF THE INVENTION

It is the first object of the present invention to provide a film forming method and a film forming apparatus using only a small amount of processing solution and capable of forming a solution film with a uniform thickness.

It is the second object of the present invention to provide a film forming apparatus capable of forming solution films having different film thicknesses by adjusting the viscosity of a single processing solution.

The present invention provides a film forming method comprising the steps of supplying a processing solution to a surface of an object to be processed, supplying a solvent of the processing solution into a processing atmosphere surrounding the object, and spreading the processing solution over the entire surface of the object by rotating the object in the processing atmosphere to which the solvent is supplied, thereby forming a film of the processing solution on the surface of the object.

The present invention provides a film forming apparatus comprising holding means for holding an object to be processed so that the object can horizontally rotate, processing solution supply means for supplying a processing solution to a surface of the object, first solvent supply means for supplying a solvent of the processing solution to the surface of the object, a processing vessel for surrounding the object and forming a processing atmosphere inside the processing vessel, and second solvent supply means for supplying the solvent into the processing atmosphere.

The present invention provides a film forming apparatus comprising holding means for rotatably holding an object to be processed, processing solution supply means for supplying a processing solution to a surface of the object, a processing solution supply source for supplying the processing solution to the processing solution supply means, a processing solution supply pipe line for connecting the processing solution supply means and the processing solution supply source, and viscosity adjusting means, provided among the processing solution supply pipe line, for adjusting a viscosity of the processing solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1C are schematic views each showing the state of a resist solution when a wafer W is coated with the resist solution;

FIG. 5 is a graph showing the film thickness distributions of resist films of a comparative example;

FIG. 6 is a graph showing the film thickness distributions of resist films formed by using the film forming apparatus according to the first embodiment;

FIG. 7 is a flow chart showing a modification of the resist film formation steps done by the film forming apparatus according to the first embodiment;

FIG. 16 is a schematic view showing a film forming apparatus according to the third embodiment; and FIG. 17 is a schematic view showing a film forming apparatus according to the fourth embodiment.

DETAILED DESCRIPTION OF THE INVENTION

Embodiments of the present invention will be described in detail below with reference to the accompanying drawings.

As the first embodiment according to the first invention of the present application, a case where a film forming apparatus of the present invention is applied to a resist solution coating-developing system for a semiconductor wafer will be described below.

Figure 2:
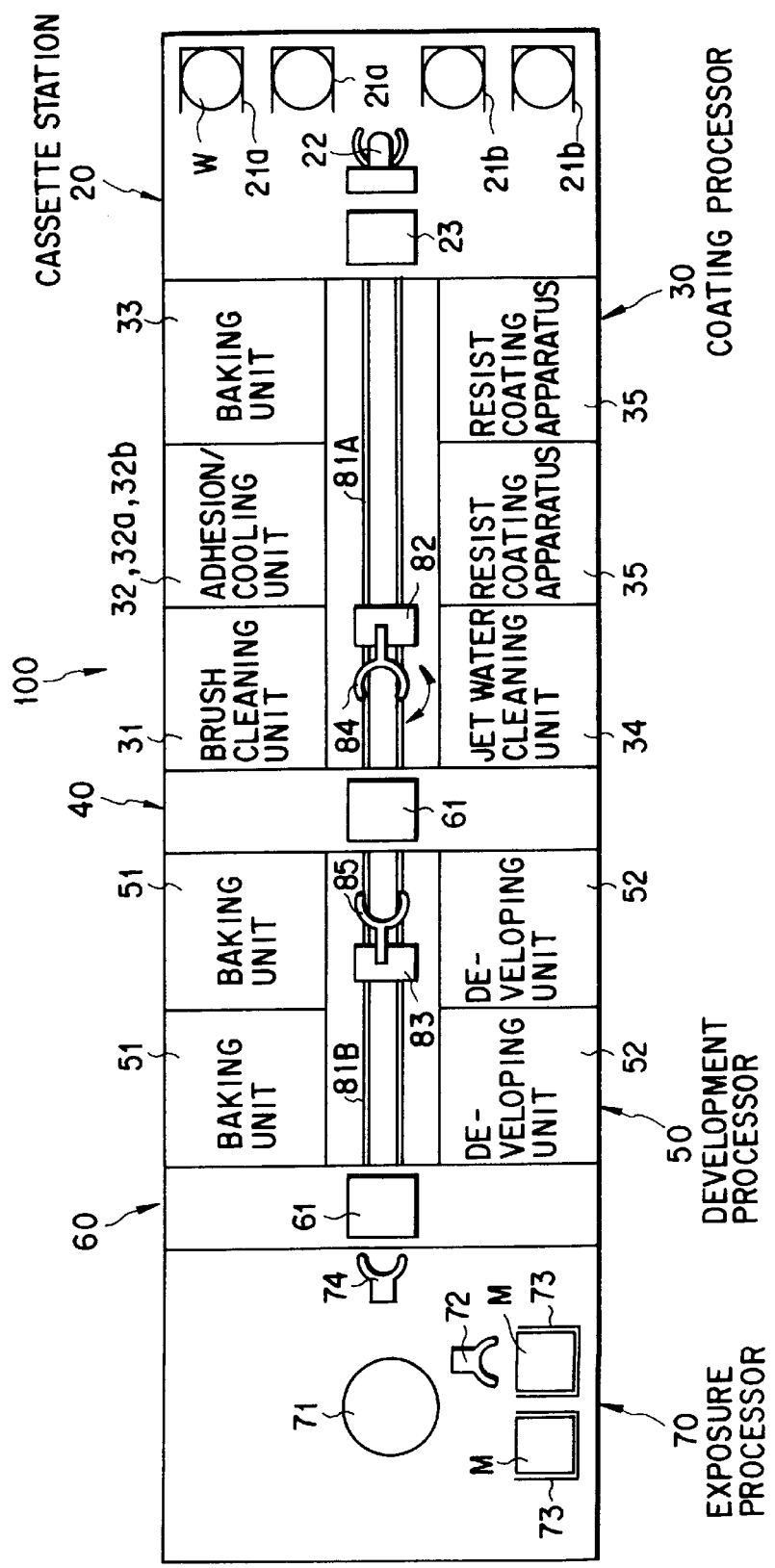
FIG. 2 is a schematic view showing a resist solution coating-developing system comprising a film forming apparatus according to the first embodiment.

FIG. 2 is a schematic view showing the resist solution coating-developing system to which one embodiment of the film forming apparatus according to the first invention of the present application is applied.

As shown in FIG. 2, a resist solution coating-developing system 100 comprises a cassette station 20 in which first cassettes 21a for storing unprocessed objects, e.g., wafers W and second cassettes 21b for storing processed wafers W are arranged in the respective predetermined positions, and which includes a wafer W transfer forceps 22 for loading and unloading the wafer W between these cassettes 21a and 21b and a transfer table 23, a coating processor 30 disposed adjacent to the cassette station 20 to form a resist film on the surface of the wafer W, a development processor 50 disposed next to the coating processor 30 with an interface unit 40 between them to develop the exposed wafer W, and an exposure processor, i.e., exposure apparatus 40 disposed next to the development processor 50 with an interface unit 60 between them to irradiate ultraviolet light from a light source onto the coated wafer W via a predetermined mask member M and expose the resist film to a predetermined circuit pattern.

Linear transfer paths 81A and 82B extend in central portions of the coating processor 30 and the development processor 50, respectively. Transfer mechanisms 82 and 83 are movable along the transfer paths 81 and 82, respectively.

The transfer mechanisms 82 and 83 have wafer transfer arms 84 and 85, respectively, which can move in X and Y directions in a horizontal plane and in a vertical direction (Z direction) and freely rotate (θ).

On one side along the side edge of the transfer path 81A in the coating processor 30, a brush cleaning unit 31, an adhesion/cooling unit 32 which performs a hydrophobic treatment and in which an adhesion unit 32a and a cooling unit 32b are stacked, and a baking unit 33 as a first heating unit are arranged adjacent to each other in a line. On the other side of the transfer path 81A, a jet water cleaning unit 34 and an arbitrary number of, e.g., two resist coating apparatuses 35 as film forming apparatuses are arranged adjacent to each other in a line. These resist coating apparatuses 35 spin-coat wafers W with two types of resist solutions: a regular resist solution and an antireflection resist solution.

The baking unit 33 and the resist coating apparatuses 35 oppose each other on the two sides of the transfer path 81A. Since the baking unit 33 and the resist coating apparatuses 35 thus oppose each other at a distance on the two sides of the transfer path 81A, heat from the baking unit 33 is prevented from being conducted to the resist coating apparatuses 35. Consequently, when resist coating is performed the resist film can be protected from thermal influences.

Figure 3:
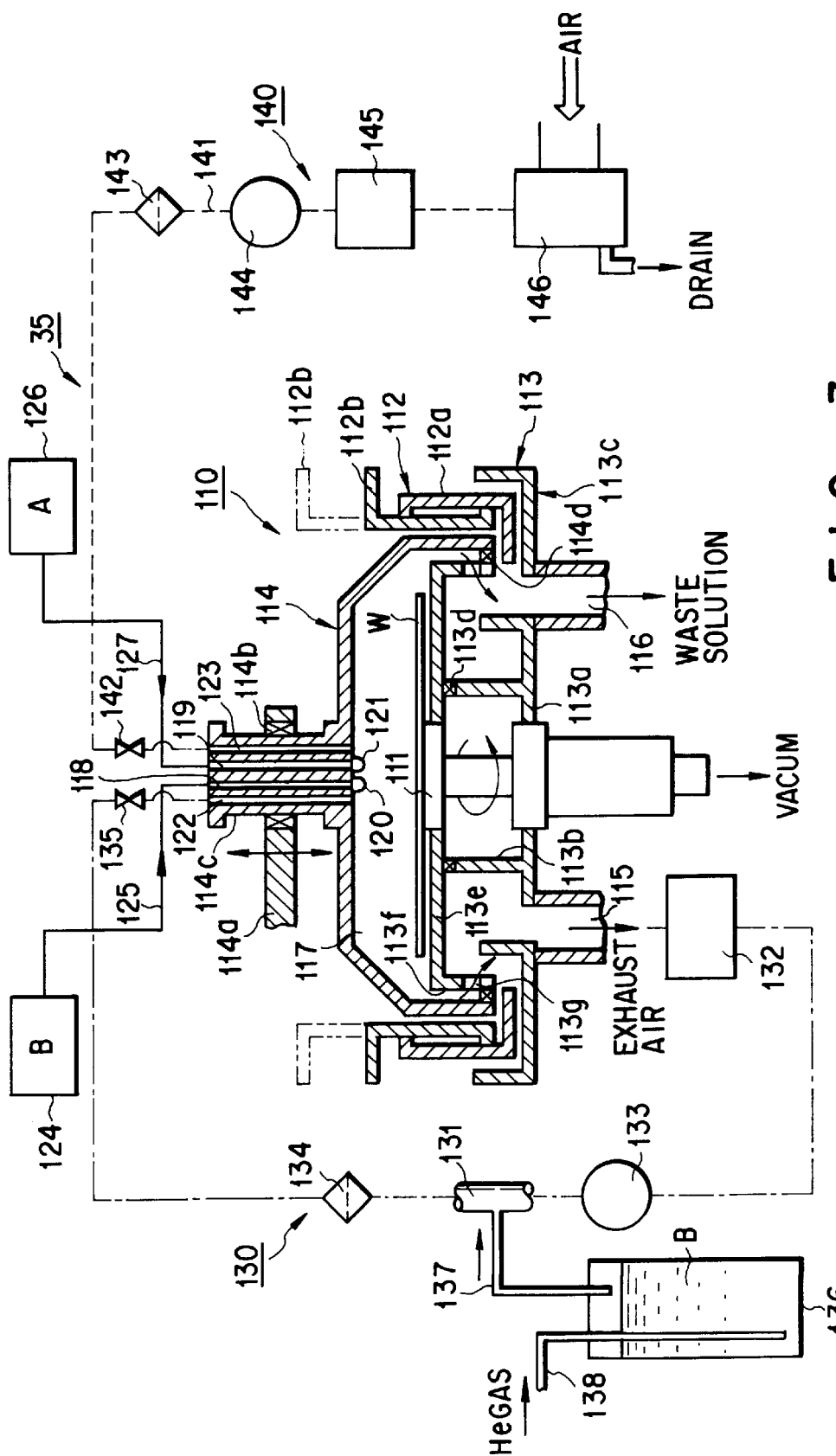
FIG. 3 is a schematic view showing the film forming apparatus according to the first embodiment.

As shown in FIG. 3, the resist coating apparatus 35 comprises a processing vessel 110 which forms a closed processing chamber isolated from the atmosphere in the coating processor 30. The processing vessel 110 incorporates a spin chuck 111 as a table capable of vertically moving and horizontally rotating.

The major parts of the processing vessel 110 are an outer vessel 112 whose upper portion for surrounding the perimeter of the wafer W can vertically move, an inner vessel 113 which forms the bottom of the processing vessel 110, and a lid 114 which closes the upper opening of the outer vessel 112.

The outer vessel 112 consists of a cylindrical outer vessel main body 112a for surrounding the wafer W on the spin chuck 111 and a cylindrical movable wall 112b so attached as to be vertically movable to the outer vessel main body 112a. Also, the movable wall 112b can be vertically moved with respect to the outer vessel main body 112a by an elevator arm (not shown).

The inner vessel 113 consists of an inner vessel main body 113c, in which a cylindrical wall 113b extends from the upper surface of a bottom 113a which is preferably inclined outward so that the waste solution flows, and a rotary member 113e which is disposed on the upper end of the cylindrical wall 113b via a bearing 113d so as to be rotatable in a horizontal plane and is connected to and rotated by the spin chuck 111. A cylindrical hanging wall 113f projects downward from the lower edge of the rotary member 113e. A plurality of holes 113g communicating with an exhaust port 115 and a waste solution port 116 in the lower portion of the processing vessel 110 are formed in proper positions of the hanging wall 113f.

The lid 114 has the shape of a dome having a rotating shaft 114c suspended by a suspension arm 114a via a bearing 114b so as to be rotatable in a horizontal plane. The lid 114 is airtightly brought into contact with the rotary member 113e via a sealing member 114d, such as an O ring, provided in the inner circumferential surface of the hole in the lower portion of the lid 114. In this contact state, the lid 114 forms a closed processing space 117 and the rotating force from the rotary member 113e is transmitted to the lid 114. Also, the lid 114 can be vertically moved by the suspension arm 114a which is vertically moved by an elevator mechanism (not shown).

The lid 114 further has a first solvent supply passage 118 and a resist solution supply passage 119 which are formed through the rotating shaft 114c and so connected as to be relatively rotatable to a solvent supply pipe 125, which is connected to a solvent supply source 124, and a resist solution supply pipe 127, which is connected to a resist solution supply source 126, respectively. A solvent supply nozzle 120 and a resist solution supply nozzle 121 connected to the first solvent supply passage 118 and the resist solution supply passage 119, respectively, are formed integrally with the lid 114 so that these nozzles can rotate together with the lid 114.

The lid 114 also has a second solvent supply passage 122 and a dry air supply passage 123 which are formed through the rotating shaft 114c and so connected as to be relatively rotatable to a circulating pipe line 131 and a dry air supply pipe line 141, respectively.

In this first embodiment, the circulating pipe line 131 is formed between the second solvent supply passage 122 and the exhaust port 115. In this circulating pipe line 131, a gas-liquid separator 132 for separating liquids from the exhaust gas, an air fan 133, a filter 134, and a valve 135 are arranged in this order from the exhaust port 115. Additionally, an ejection pipe 137 connecting to a tank 136 which contains a solvent, i.e., a thinner B, of the resist solution A is connected to a portion of the circulating pipe line 131 between the air fan 133 and the filter 134. The tank 136 is connected to a carrier gas supply source (not shown) as a carrier gas supply means via a carrier gas supply pipe 138. The thinner B is made to flow into the circulating pipe line 131 by a carrier gas, e.g., He gas, supplied from the carrier gas supply source into the thinner B in the tank 136. The thinner B is sprayed by air flowing in the circulating pipe line 131 and supplied to the processing space 117 in the processing vessel 110. An atmosphere control means 130 is constructed as described above.

Note that He gas is used as the carrier gas in this embodiment, it is also possible to use an inert gas such as N2 gas or Ar gas instead of He gas.

In the dry air supply pipe line 141, on the other hand, a valve 142, a filter 143, an air fan 144, and a temperature controller 145 are arranged, and a dehumidifying means, e.g., a dehumidifier 146 is connected the dry air supply pipe line 141. A dry air supply mechanism 140 as an atmosphere releasing means is constructed as described above. Air dehumidified to a predetermined humidity, e.g., 40% or less by the dehumidifier 146 of this dry air supply mechanism 140 is set at a predetermined temperature, e.g., room temperature (approximately 23° C.) by the temperature controller 145 and supplied into the processing space 117 of the processing vessel 110.

In the development processor 50, two baking units 51 as second heating units for chemically sensitizing the exposed resist film are arranged adjacent to each other in a line on one side along the side edge of the transfer path 81B. On the other side of the transfer path 81B, a plurality of, e.g., two developing units 52 are arranged to oppose the baking units 51. Each of these developing units 52 comprises, e.g., a developing device which spin-coats the wafer with a developer. Since the baking units 51 and the developing units 52 oppose each other at a distance on the two sides of the transfer path 81B, heat from the baking units 51 is prevented from being conducted to the developing units 52. Consequently, when development is performed the resist film can be protected from thermal influences.

The exposure processor 70 is connected to the development processor 50 via the interface unit 60 comprising a transfer table 61 for transferring the wafer W. This exposure processor 70 includes a wafer table 71 and a light irradiating means (not shown). On one side of the exposure processor 70, a cassette 73 for storing the mask member M to be placed on the upper surface of the wafer W set on the wafer table 71 is arranged. A mask member transfer arm 72 for transferring the mask member M between the cassette 73 and the wafer table 71 is also provided so as to be movable in the X, Y, and Z directions and rotatable (θ).

The exposure processor 70 further has a wafer transfer arm 74 for transferring the wafer W with respect to the interface unit 60 arranged between the exposure processor 70 and the development processor 50. This wafer transfer arm 74 can also move in the X, Y, and Z directions and rotate (θ).

Figure 4:
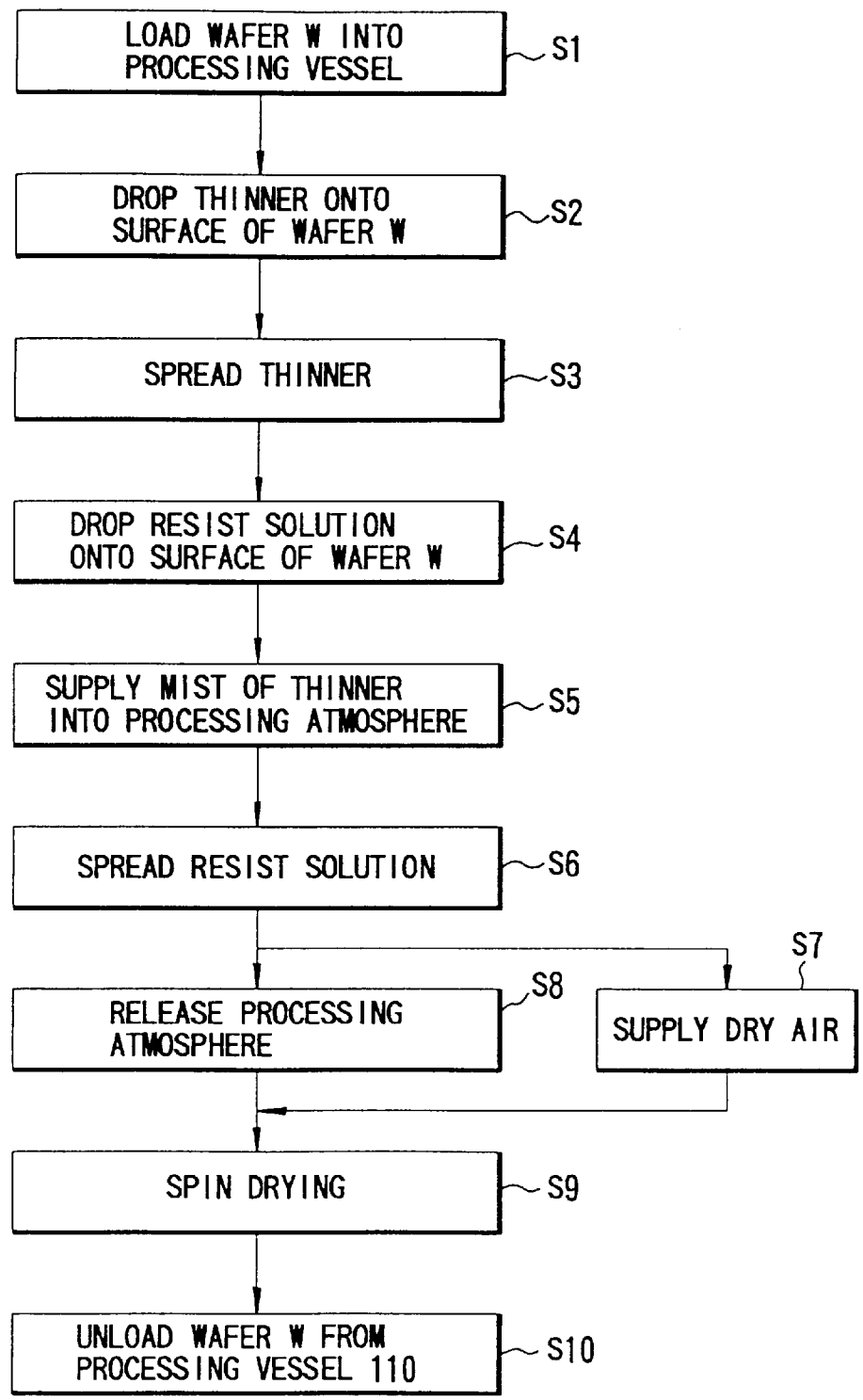
FIG. 4 is a flow chart showing resist film formation steps performed by the film forming apparatus according to the first embodiment.

Resist processing steps performed for the wafer W by the resist solution coating-developing system 100 according to the first embodiment of the first invention of the present application having the above arrangement will be described below with reference to FIGS. 2, 3, and 4. FIG. 4 is a flow chart showing resist film formation steps in the resist coating apparatuses 35 of the resist solution coating-developing system 100 according to the first embodiment.

First, in the cassette station 20, the transfer forceps 22 receives an unprocessed wafer W from a cassette 21a and places the wafer W on the transfer table 23. On the transfer table 23, the wafer W is centered.

Next, the transfer mechanism 82 transfers the wafer W to the brush cleaning unit 31 of the coating processor 30. The brush cleaning unit 31 cleans the wafer W with a brush. The wafer W is then transferred to the jet water cleaning unit 34 and cleaned with jet water. Thereafter, the wafer W is transferred to the adhesion unit 32a. The adhesion unit 32a heats the wafer W and makes the wafer W hydrophobic in order to improve the adhesion between the wafer W and the resist solution. The wafer W thus subjected to the hydrophobic treatment is cooled in the cooling unit 32b.

The cooled wafer W is loaded into the processing vessel 110 of the resist coating apparatus 35 shown in FIG. 3 (S1 in FIG. 4). More specifically, the wafer W is loaded by the transfer mechanism 82 into the processing vessel 110 whose lid 114 is moved upward, and is held by the spin chuck 111 by, e.g., vacuum suction.

Subsequently, the wafer transfer arm 84 of the transfer mechanism 82 is moved backward, and the solvent, e.g., the thinner B, of the resist solution A is supplied from the solvent supply source 124 through the solvent supply pipe 125 and dropped from the solvent supply nozzle 120 onto the surface of the wafer W (S2 in FIG. 4).

Thereafter, the wafer W is rotated by the rotation of the spin chuck 111 to spread the thinner on the entire surface of the wafer W (S3 in FIG. 4). Simultaneously with the spreading of the thinner, the resist solution A is supplied from the resist solution supply source 126 through the resist solution supply pipe 127 and dropped from the resist solution supply nozzle 121 onto the surface of the wafer W (S4 in FIG. 4).

At the same time, a spray of thinner B is supplied to the processing atmosphere (S5 in FIG. 4). More specifically, the lid 114 is moved down to close the processing vessel 110, forming the processing space 117. Meanwhile, He gas is supplied from the carrier supply source into the thinner B contained in the tank 136. Consequently, the He gas containing the thinner B is supplied from the ejection pipe 137 into the circulating pipe line 131. The thinner B is sprayed by air flowing in the circulating pipe line 131. Consequently, sprayed thinner B, i.e., mist of thinner B generate. By opening the valve 135, this mist of thinner B is supplied from the circulating pipe line 131 into the processing space 117 through the second solvent supply passage 122. As a result, the processing space 117 is filled with the mist of thinner B. In other words, the mist of thinner B is supplied into the processing atmosphere surrounding the wafer W, allowing the processing atmosphere to contain a large amount of thinner. The processing atmosphere is substantially saturated with the solvent. In the three steps indicated by S3 to S5 in FIG. 4, the resist solution A is spread on the entire surface of the wafer W (S6 in FIG. 4).

After the resist solution A spreads on the entire surface of the wafer W, the valve of the atmosphere control means 130 is closed and at the same time the valve 142 of the dry air supply mechanism 140 is opened. Consequently, while dry air is supplied into the processing space 117 the air containing the mist of thinner B is exhausted from the processing space 117 through the holes 113g and the exhaust port 115 (S7 in FIG. 4). The result is that the atmosphere containing the mist of thinner B in the processing space 117 is replaced with the dry air atmosphere.

It is also possible to release the processing space 117 by moving the lid 114 upward and diffuse the air containing the mist of thinner B into the surrounding atmosphere, without supplying the dry air into the processing space 117 as described above. In other words, the processing atmosphere filled with the mist of thinner B in the processing space 117 can also be released (S8 in FIG. 4).

Simultaneously with the supply of the dry air or the release of the processing atmosphere described above, the solvent in the resist solution film formed on the surface of the wafer W is spin-dried to form a resist film (S9 in FIG. 4). The wafer W on which the resist film is formed is unloaded from the resist coating apparatus 35 and transferred to the baking unit 33 (S10 in FIG. 4). Thereafter, the baking unit 33 bakes the wafer W to evaporate the solvent in the resist film.

Subsequently, the wafer W subjected to the resist coating processing as above is transferred to the transfer table 41 of the interface unit 40 and received by the wafer transfer arm 85 of the transfer mechanism 83 provided in the development processor 50. The wafer W is then transferred to the table 61 of the interface unit 60 and positioned. The wafer W is transferred to the table 71 by the transfer arm 74 of the exposure processor 70, irradiated with light from a light source via the mask member M, and exposed by projecting a predetermined pattern in a reduced scale. The wafer W thus exposed is transferred to the baking unit 51 of the development processor 50 through the interface unit 60 by the wafer transfer arm 85. The wafer W is baked in the baking unit 51, transferred to the developing unit 52, and developed. The developed wafer W is again transferred to the baking unit 31 and post-baked, thereby enhancing the pattern strength.

The wafer W subjected to the resist coating, exposure, and development as described above is transferred to the transfer table 23 of the cassette station 20, received by the transfer forceps 22, and transferred to a cassette 21b for storing processed wafers W. In this manner the resist coating, exposure, and development for the wafer W are completed.

An experiment conducted by using the resist coating apparatus 35 as the film forming apparatus according to the first embodiment will be described below. In this experiment, resist films were coated by forming various processing atmospheres in the processing space 117 formed in the processing vessel 110 of the resist coating apparatus 35 shown in FIG. 3.

First, as a comparative embodiment, a resist film was formed following the same procedure as in the flow chart of FIG. 4 except that the processing atmosphere was not filled with a mist of thinner B without supplying any mist of thinner B. That is, after the thinner B was dropped onto the surface of the wafer W, the wafer W was rotated to spread out the thinner B and at the same time 0.2 l or 0.6 ml of the resist solution A were dropped onto the surface of the wafer W. Subsequently, the wafer W was rotated at 5000 rpm for 5 sec to spread the resist solution A. Thereafter, the thinner in the resist solution A was dried by evaporation. The film thicknesses of the resultant resist films were measured. The results are shown in FIG. 5.

As is apparent from FIG. 5, the resist film thickness was 8000 to 8750 Å in the center of the wafer W, whereas the resist film thickness was 7000 Å or less on the edge of the wafer W; the difference between the center and the edge of the wafer was 1750 to 1000 Å. In addition, vertical stripes were formed on the edge of the wafer W to make the resist film thickness uneven. It was also found that when the ejection amount of resist solution A was 0.2 ml, the resist solution A did not cover the entire surface of the wafer W and set before the edge of the wafer W.

Subsequently, in accordance with the flow chart shown in FIG. 4, a mist of thinner B was supplied into the processing space 117 to fill the processing atmosphere with the mist of thinner B and the resist solution A was spread following the same procedure as in the first embodiment described above. That is, after 0.4 ml of the resist solution A were dropped onto the surface of the wafer W, a mist of thinner B was supplied into the processing space 117. In this mist of thinner B atmosphere, the resist solution A was spread by rotating the wafer W at 2000 rpm while the rotation time was changed to 3, 4, 5, 6, and 7 sec. Thereafter, the thinner in the resist solution A was dried by evaporation. The film thicknesses of the resultant resist films were measured. The results are shown in FIG. 6.

As shown in FIG. 6, when the shortest rotation time of 3 sec was set, the resist film thickness was 12,000 to 12,400 Å in the center of the wafer W, whereas the resist film thickness was 10,000 to 11,000 Å on the edge of the wafer W; the film thickness difference between them was as large as 1400 to 2000 Å. However, when the rotation time was 4 to 7 sec, it was possible to decrease the film thickness difference between the center and the edge of the wafer W.

Note that a slight unevenness occurred in the center of the wafer and it is considered that this unevenness was caused by the center of an eddy current (tornado) of the air stream supplied into the processing atmosphere.

It is confirmed from the above results that in the first invention of the present application in which a solvent, e.g., a thinner, of a resist solution is supplied in the form of a spray, i.e., mist, into a processing atmosphere when the resist solution is spread on the surface of the wafer W, it is possible to evenly coat the wafer W with the resist solution without increasing the rotating speed of the wafer W and decrease the use amount of resist solution A. It is also found that the invention is suitable in resist coating processing for 8" and 12" wafers because the rotating speed of the wafer W can be decreased. Furthermore, since the amount of waste solution can be decreased, clogging of the drain can be prevented.

In the resist solution coating-developing process to which the film forming method according to the first embodiment of the first invention of the present application is applied, as shown in FIG. 3, the processing vessel 110 of the resist coating apparatus 35 comprises the outer vessel 112, the inner vessel 113, and the lid 114 and forms the processing space 117 by moving the lid 114 downward. The resist coating apparatus 35 also includes the atmosphere control means 130 for supplying a mist of thinner into the processing space 117. In the resist coating apparatus 35 with this construction, as shown in FIG. 4, after the resist solution is dropped (S4 in FIG. 4) the processing space 117 is formed by lowering the lid 114. Consequently, the processing atmosphere in the processing space 117 is isolated from the surrounding atmosphere outside the processing space 117. Subsequently, the atmosphere control means 130 is used to supply a mist of thinner from the tank 136 to the processing space 117 through the ejection pipe 137, the circulating pipe line 131, and the second solvent supply passage 122, thereby filling the processing space 117 with the mist of thinner. In the processing atmosphere in the processing space 117 thus filled with the mist of thinner, evaporation of the thinner in the resist solution A is suppressed. This protects the end portion of the resist solution A from setting due to evaporation of the thinner when the resist solution A is spread. As a consequence, the thickness of the film of the resist solution, i.e., the solution film can be made uniform in the plane of the wafer W. Finally, the thickness of the resultant resist film can be made uniform. Also, the use amount of resist solution can be decreased.

Additionally, as backed up by the above experiment, the resist coating processing using the resist coating apparatus 35 according to the first embodiment can form a resist film with a uniform thickness even when the rotating speed of the wafer W at which the resist solution A is spread is low. Therefore, this first embodiment is suited to resist coating processing for large-diameter wafers W.

Furthermore, in the film forming method of the first embodiment according to the first invention of the present application, clogging of the drain can be prevented because the amount of waste solution can be decreased.

The resist coating apparatus 35 also includes the dry air supply mechanism 140. After the spreading of the resist solution in the processing atmosphere filled with the mist of thinner is completed, the dry air supply mechanism 140 supplies dry air into the processing space 117 and thereby replaces the thinner atmosphere with the dry air. By this release of the processing atmosphere, the thinner in the coated and diffused resist solution efficiently evaporates. This shortens the time of the resist coating processing. The resist solution dries more rapidly especially when the wafer W is rotated by the spin coater 111 in this dry air atmosphere. This further reduces the resist coating time.

In the above first embodiment, as shown in FIG. 4, after the resist solution A is dropped onto the surface of the wafer W (S4 in FIG. 4), the processing space 117 is filled with the spray of thinner (S5 in FIG. 4). However, as shown in FIG. 7, it is also possible to drop the resist solution A onto the surface of the wafer W (S5' in FIG. 7) after the processing space 117 is filled with the spray of thinner (S4' in FIG. 7). Thus, in the film forming method of the present invention, it is only necessary to fill the processing atmosphere with a mist of thinner when the resist solution A is spread.

Figure 8:
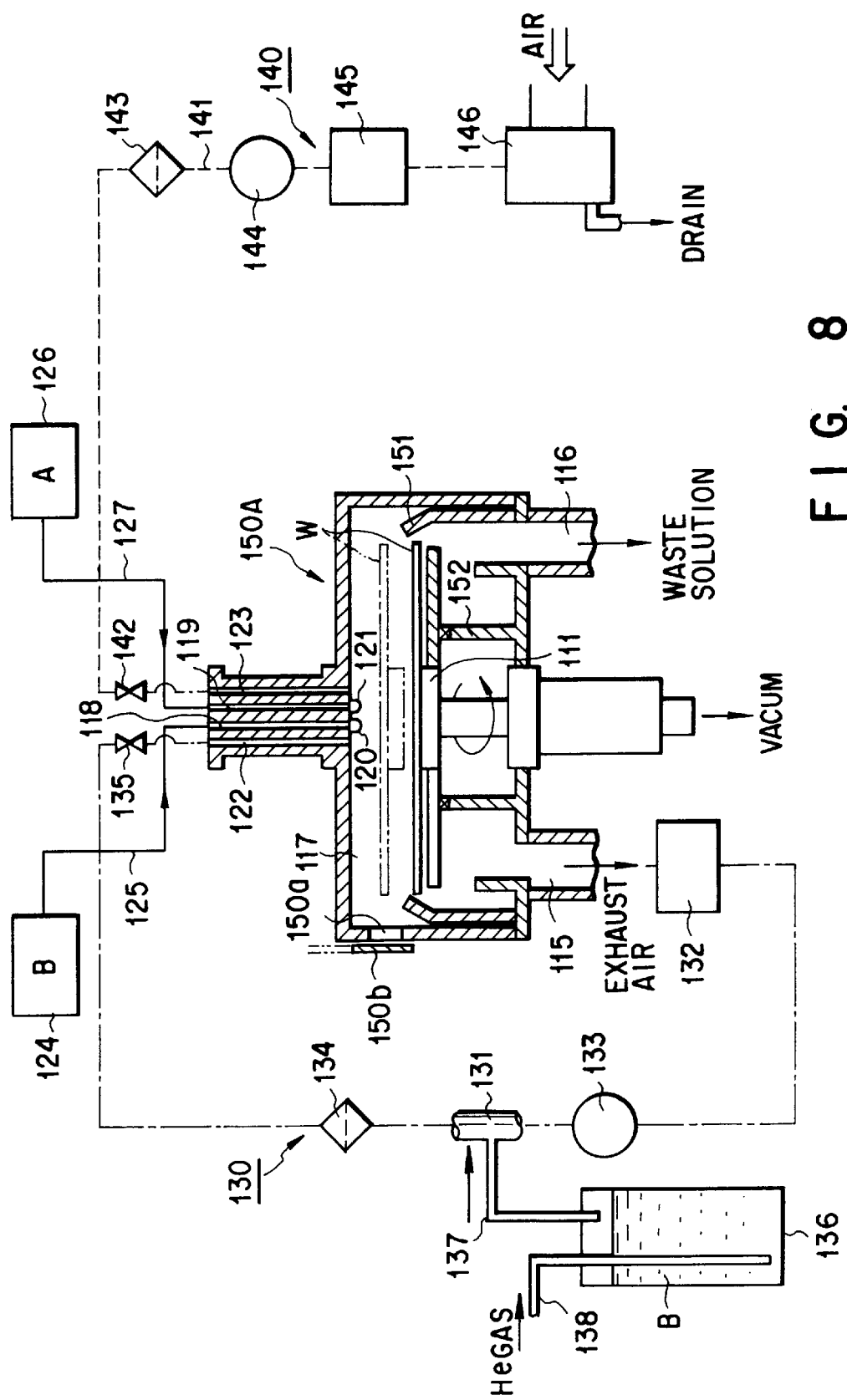
FIG. 8 is a schematic view showing a modification of a processing vessel of the film forming apparatus according to the first embodiment.

In the first embodiment, the processing vessel 110 for forming the processing space 117 comprises the outer vessel 112 whose upper portion surrounding the perimeter of the wafer W can vertically move, the inner vessel 113 which forms the bottom of the processing vessel 110, and the lid 114 which closes the upper opening of the outer vessel 112. However, the processing vessel 110 does not necessarily have this structure. For example, as shown in FIG. 8, the processing space 117 can also be formed by a processing space 150A having a hole 150a which is formed in one side wall of the processing space 150A and through which the wafer W is loaded and unloaded, and a shutter 150b which is driven by a driving means such as a cylinder (not shown) to open and close the hole 150a. In FIG. 8, reference numerals 151 and 152 denote an outer vessel and an inner vessel, respectively. The same reference numerals as in the resist coating apparatus 35 shown in FIG. 3 denote the same parts in FIG. 8 and a detailed description thereof will be omitted.

In the first embodiment as described above, the first invention of the present application is applied to a semiconductor wafer coating-developing system. However, the film forming method and the film forming apparatus according to the first invention of the present application is also applicable to a system in which a resist film is formed by coating an object to be processed other than a semiconductor wafer, e.g., an LCD substrate, a glass substrate, a CD substrate, a photomask, a printed substrate, or a ceramic substrate, with a resist solution. The first invention of the present application can also be applied to a system in which a solution film with a uniform film thickness is formed by coating the surface of an object to be processed with various processing solutions other than a resist solution, e.g., a developing solution and a cleaning solution. Furthermore, the first invention can be applied to a system in which a coating film with a uniform film thickness is formed on the surface of the wafer W by performing processing such as drying of a solvent for a solution film. In accordance with the type of processing solution to be used, it is possible to properly select and use a solvent to be supplied into the processing space 117. This solvent is not necessarily the same as the solvent used in the processing solution and need only be usable as the solvent of the processing solution.

The second embodiment of a film forming apparatus according to the second invention of the present application will be described below. In this second embodiment, the film forming apparatus according to the second invention of the present application is applied to a resist solution coating-developing system for a semiconductor wafer.

Figure 9:
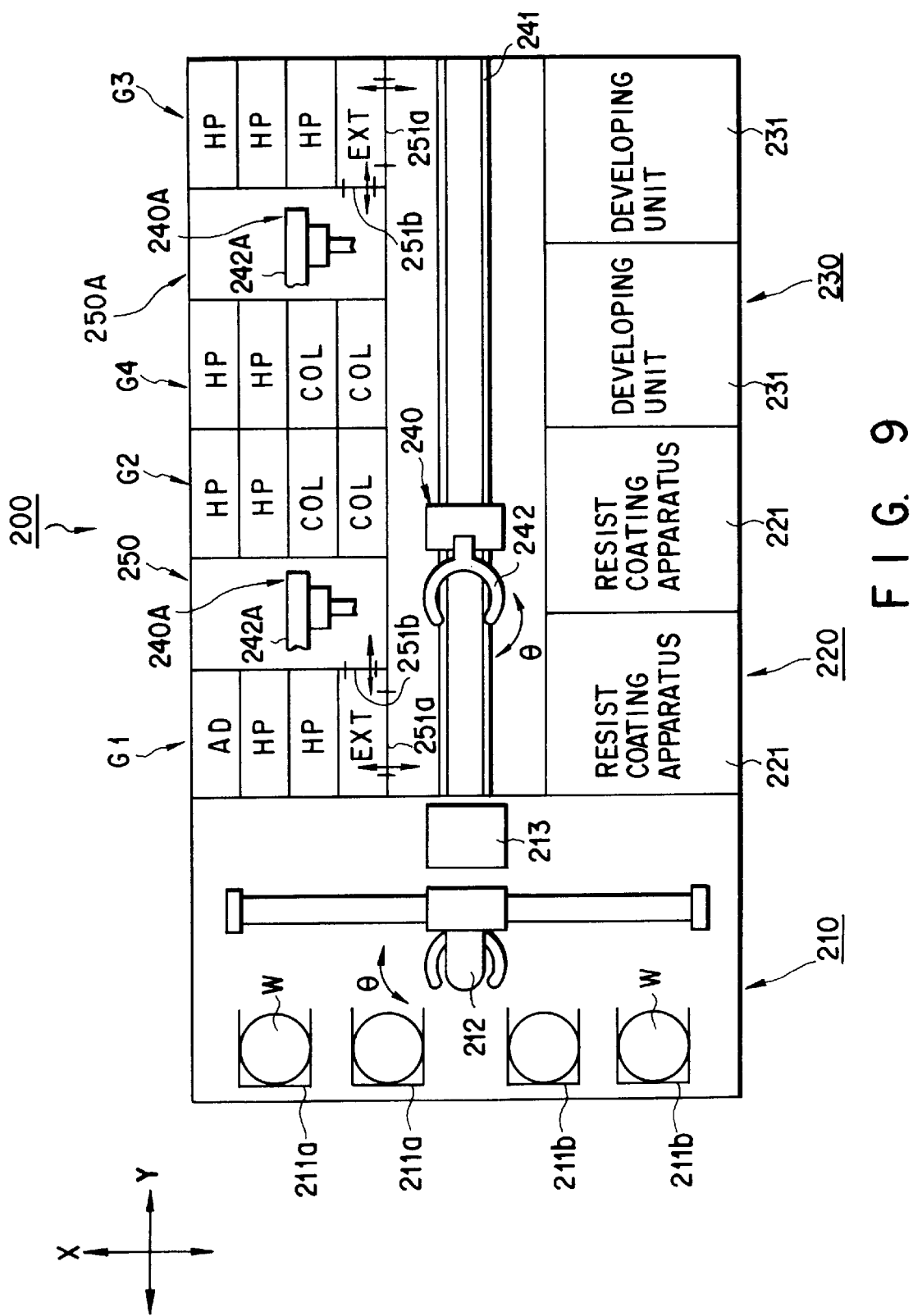
FIG. 9 is a schematic view showing a resist solution coating-developing system comprising a film forming apparatus according to the second embodiment of the present invention.

A resist solution coating-developing system 200 shown in FIG. 9 comprises a cassette station 210 including wafer cassettes 211a each of which stores a plurality of, e.g., 25 unprocessed wafers W and wafer cassettes 211b each of which stores a plurality of, e.g., 25 processed wafers, a coating processor 220 including the film forming apparatuses according to the second invention of the present application each of which coats the wafer W with a processing solution, e.g., a resist solution, a development processor 230 including developing units for developing the wafer W which is exposed by an exposure unit (not shown), a main wafer transfer mechanism 240 for transferring the wafer W in the coating processor 220 and the development processor 230, and an auxiliary wafer transfer mechanism 240A.

The cassette station 210 has a wafer transfer forceps 212 for loading and unloading the wafer W into and from an unprocessed wafer cassette 211a or a processed wafer cassette 211b, and a wafer transfer table 213. The wafer transfer forceps 212 is so formed as to be horizontally movable in the X and Y directions, rotatable in the θ direction, and also movable in the vertical (Z) direction. The wafer transfer forceps 212 unloads an unprocessed wafer W stored in a wafer cassette 211a from the cassette 211a and transfers the wafer W to the transfer table 213. Also, the wafer transfer forceps 212 receives a processed wafer W processed by the processors 220 and 230 from the transfer table 213 and loads the wafer W into a wafer cassette 211b.

In the coating processor 220, a transfer path 241 is formed in a central portion along the longitudinal direction. The main wafer transfer mechanism 240 is movably attached to this transfer path 241. The main wafer transfer mechanism 240 has two, upper and lower wafer transfer arms 242 which are so formed as to be movable in a direction (X direction) perpendicular to the transfer direction (Y direction), rotatable in the θ direction, and also movable in the vertical direction (Z direction).

Two resist coating apparatuses 221 are juxtaposed to each other on one side along the transfer path 241, and a processor 250 is disposed on the other side. This processor 250 comprises first and second processing unit groups G1 and G2 and the auxiliary wafer transfer mechanism 240A for loading and unloading the wafers W into and from these processing unit groups G1 and G2. Like the main wafer transfer mechanism 240, the auxiliary wafer transfer mechanism 240A has two, upper and lower auxiliary wafer transfer arms 242A which are movable in the X, Y, and Z directions and rotatable in the θ direction (rotating direction).

Of the processing unit groups G1 and G2, in the first processing unit group G1 an extension unit (EXT), two baking units (HP), and an adhesion unit (AD) are stacked in this order from the bottom. In this embodiment, the extension unit (EXT) has two gateways 251a and 251b on the sides of the transfer path 241 and the auxiliary wafer transfer mechanism 240A, respectively. The wafers W are loaded and unloaded through these gateways 251a and 251b. In the second processing unit group G2, two cooling units (COL) and two baking units (HP) are stacked in this order from the bottom. Note that the arrangements of these processing units need not be the ones described above and can be properly altered.

The transfer path 241 disposed in the coating processor 220 extends to the development processor 230. Two developing units 231 are juxtaposed to each other on one side along the transfer path 241, and a second processor 250A is disposed on the other side. This second processor 250A comprises two, third and fourth processing unit groups G3 and G4 and an auxiliary wafer transfer mechanism 240A which loads and unloads the wafers W into and from these processing unit groups G3 and G4 and can move in the X, Y, and Z directions and rotate in the θ direction (rotating direction).

Of the processing unit groups G3 and G4, in the third processing unit group G3 an extension unit (EXT) and three hot baking units (HP) are stacked in this order from the bottom. In the fourth processing unit group G4, two cooling units (COL) and two baking units (HP) are stacked in this order from the bottom. In this embodiment, the extension unit (EXT) in the third processing unit group G3 has two gateways 251a and 251b, like the extension unit (EXT) in the first processing unit group G1, on the sides of the transfer path 241 and the auxiliary wafer transfer mechanism 240A, respectively. The wafers W are loaded and unloaded through these gateways 251a and 251b. Note that the arrangements of these processing units need not be the ones described above and can be properly changed.

The resist coating apparatus 221 as the film forming apparatus according to the second invention of the present application will be described below with reference to FIG. 10.

Figure 10:
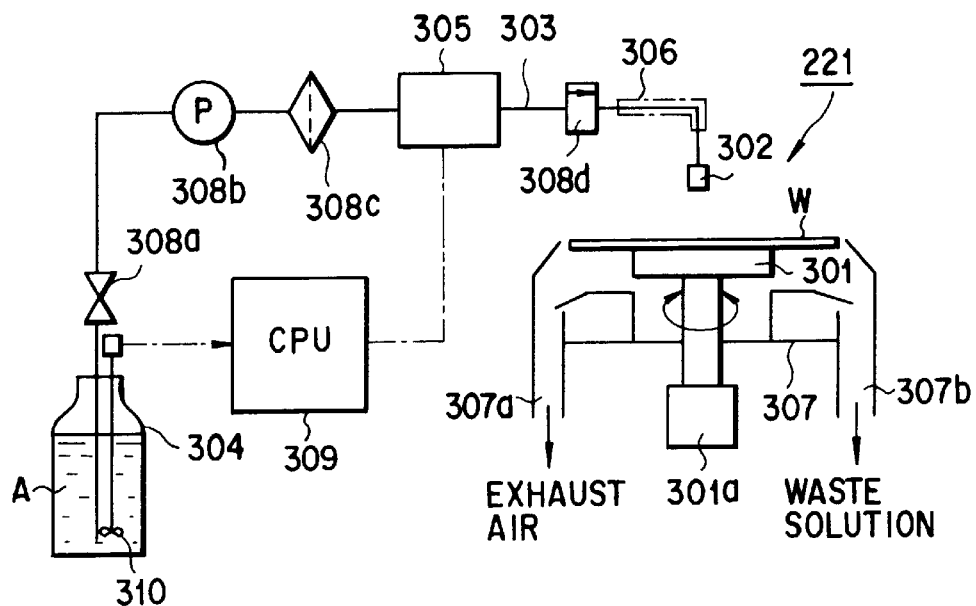
FIG. 10 is a schematic view showing the film forming apparatus according to the second embodiment.

As shown in FIG. 10, the resist coating apparatus 211 comprises a holding means, e.g., a spin chuck 301 for holding the wafer W so that the wafer W is rotatable in the horizontal direction, a resist solution supply nozzle 302 as a coating solution supply means for dropping a resist solution A as a processing solution onto a central portion of the surface of the wafer W held by the spin chuck 301, and a resist tank 304 which contains the resist solution A. The resist tank 304 is connected as a coating solution supply source to the resist solution supply nozzle 302 through a resist solution A supply pipe line 303. The supply pipe line 303 has a viscosity adjusting means, e.g., a high-viscosity adjusting unit 305 for adjusting the viscosity of the resist solution A. A temperature adjusting mechanism 306 is disposed outside the supply pipe line 303 on the side of the resist solution supply nozzle 302 from the high-viscosity adjusting unit 305. This temperature adjusting mechanism 306 can set the temperature of the resist solution A supplied from the resist solution supply nozzle 302 to a predetermined temperature, e.g., 23° C.

The spin chuck 301 is so formed as to be rotatable and vertically movable by a driving unit 301a. Also, the spin chuck 301 is connected to a vacuum pump (not shown) and can therefore hold the wafer W by suction. The exterior and lower portions of spin chuck 301 are surrounded by a cup 307. The exhaust air and the waste solution are exhausted and discharged from an exhaust port 307a and a waste solution port 307b formed in the bottom of the cup 307.

In a portion of the supply pipe line 303 between the high-viscosity adjusting unit 305 and the resist tank 304, a valve 308a, a pump 308b, and a filter 308c are disposed in this order from the resist tank 304. In addition, an air operation valve 308d is disposed between the high-viscosity adjusting unit 305 and the resist solution supply nozzle 302. The high-viscosity adjusting unit 305 can set the viscosity of the resist solution A supplied to the wafer W to a predetermined value on the basis of a signal from a control means, e.g., a central processing unit (CPU) 309 which outputs a predetermined signal (to be referred to as a viscosity signal hereinafter) on the basis of an output signal relating to the viscosity, which is sensed by a viscosity sensor 310, of the resist solution A contained in the resist tank 304.

Figure 11:
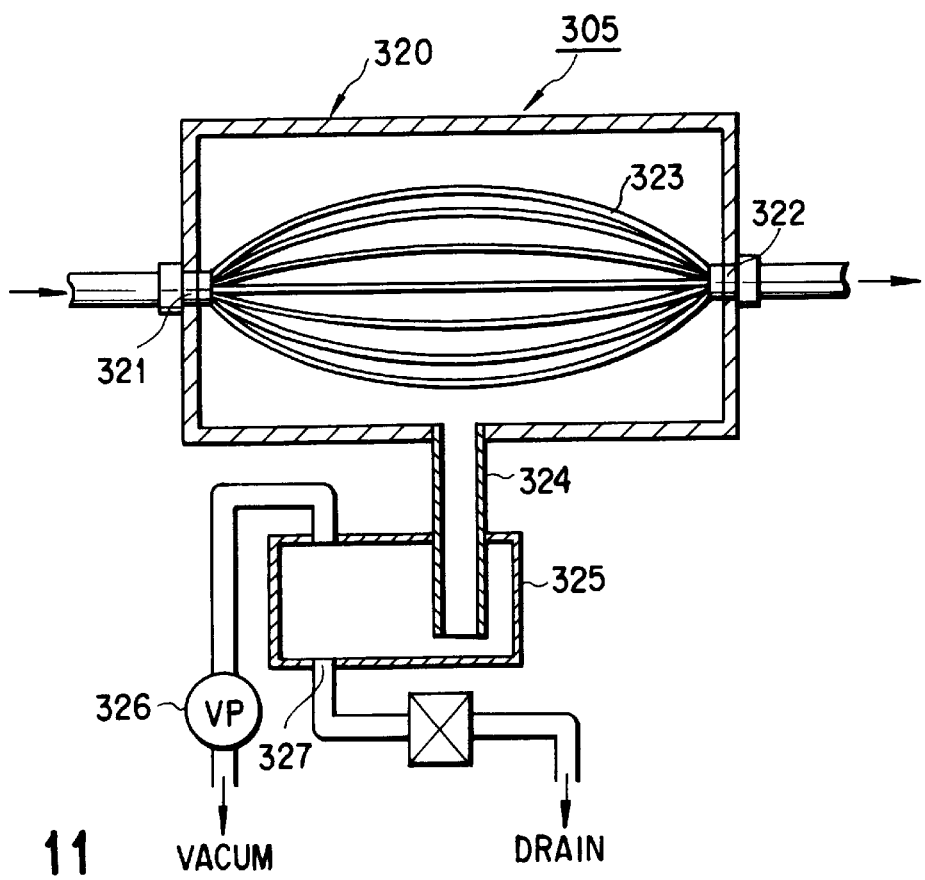
FIG. 11 is a schematic view showing a high-viscosity adjusting unit of the film forming apparatus according to the second embodiment.

In this second embodiment, as shown in FIG. 11, the high-viscosity adjusting unit 305 has a closed vessel 320 having an inlet 321 for supplying the resist solution A and an outlet 322 for discharging the resist solution A. A plurality of tubular members 323 extend from the inlet 321 to the outlet 322 in the closed vessel 320. These tubular members 323 are made from a material, e.g., a porous fluorine resin, having a function of separating a solvent, e.g., a thinner, contained in the resist solution A flowing through these tubes, from the resist solution A. The amount of resist solution A flowing through the tubular members 323 is three to four times (e.g., 10 to 15 cc) as large as one ejection amount (e.g., 3 to 4 cc) supplied from the resist solution supply nozzle 302 to the wafer W. This high-viscosity adjusting unit 305 constantly stocks the resist solution A for a plurality of ejections. It is preferable that the tubular members 323 be thinner and their number be larger.

An exhaust pipe 324 is connected to the closed vessel 320. This exhaust pipe 324 is connected to a vacuum pump 326 via a trap tank 325. By driving this vacuum pump 326, the thinner in the resist solution A flowing through the tubular members 323 from the inlet 321 to the outlet 322 can be discharged outside the tubular members 323, thereby reducing the thinner in the resist solution A. Therefore, for example, the viscosity of the resist solution A contained in the resist tank 304 is set to 5 centipoise (cp) and the vacuum pump 326 of the high-viscosity adjusting unit 305 is driven at a predetermined vacuum pressure for a predetermined time, thereby reducing the thinner in the resist solution A. Consequently, the viscosity of the resist solution A supplied to the wafer W can be set at an arbitrary viscosity, e.g., 10 cp or 15 cp. Also, by increasing the viscosity of the resist solution A, a resist film with a uniform film thickness can be effectively formed by low-speed rotation even on a large-diameter wafer. In this manner the thickness of a resist film formed on the wafer W rotating at a fixed rotating speed can be changed to a predetermined film thickness, e.g., 1.0 $\mu$m or 1.2 $\mu$m, by changing the viscosity of the resist solution A supplied to the surface of the wafer W. The thinner discharged from the tubular members 323 flows into the trap tank 325 and is discharged to the outside from a drain 327.

Figure 12:
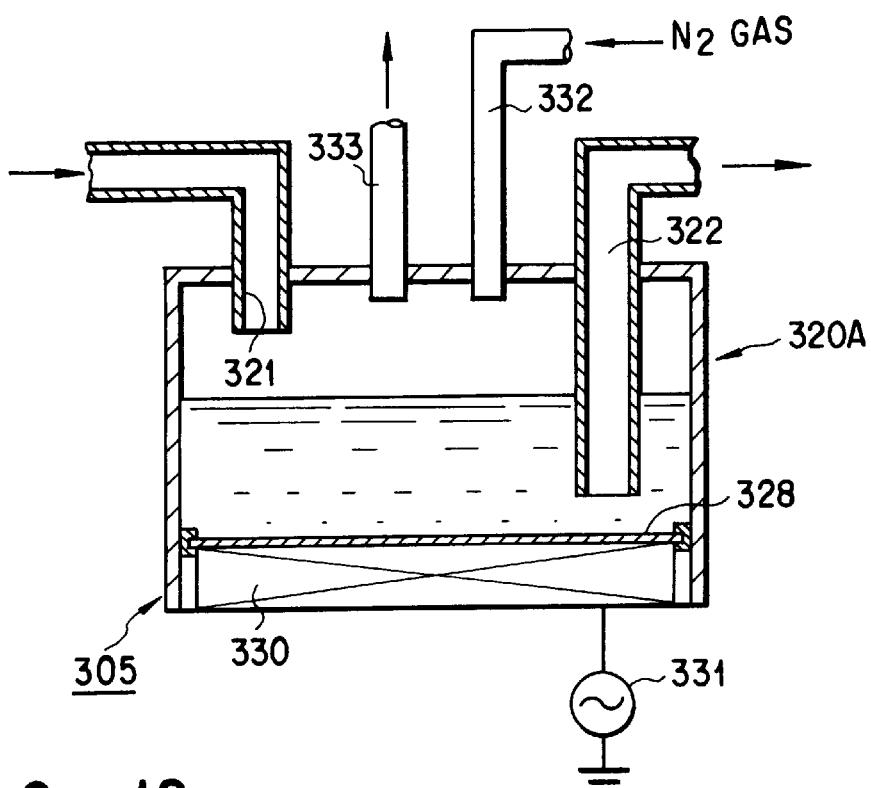
FIG. 12 is a schematic view showing a modification of the high-viscosity adjusting unit of the film forming apparatus according to the second embodiment.

The high-viscosity adjusting unit 305 is not limited to the above structure. For example, a structure as shown in FIG. 12 is also usable. In this structure, a water-tight, flexible partition 328 is formed in the bottom of a closed vessel 320A having an inlet 321 and an outlet 322. Additionally, an ultrasonic generating device 330 as an ultrasonic generating means is arranged in contact with the partition 328. The resist solution A in the closed vessel 320A is vibrated by fine vibrations from the ultrasonic generating device 330 which is driven by a high-frequency power supply 331, thereby evaporating the thinner in the resist solution A.

In this structure, an N2 gas supply pipe 322 connecting to an inert gas supply source, e.g., an N2 gas supply source (not shown) is connected to the top wall of the closed vessel 320A, and an exhaust pipe 323 is also provided. With this arrangement, the thinner evaporated from the resist solution A can be exhausted outside from the closed vessel 320A through the exhaust pipe 323 by N2 gas supplied from the N2 gas supply pipe 322 into the closed vessel 320A.

Figure 13:
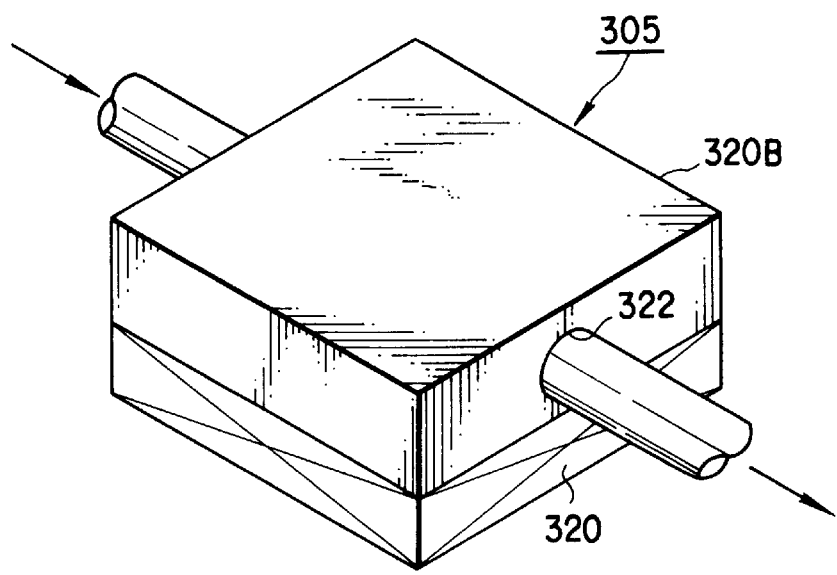
FIG. 13 is a perspective view showing a modification of a closed vessel of the high-viscosity adjusting unit shown in FIG. 12.

Also, as shown in FIG. 13, instead of the closed vessel 320A having the partition 328 as described above, the ultrasonic generating device 330 can be provided in contact with the bottom surface of a closed vessel 320B made from a semipermeable membrane which allows a thinner to permeate through it.

Figure 14:
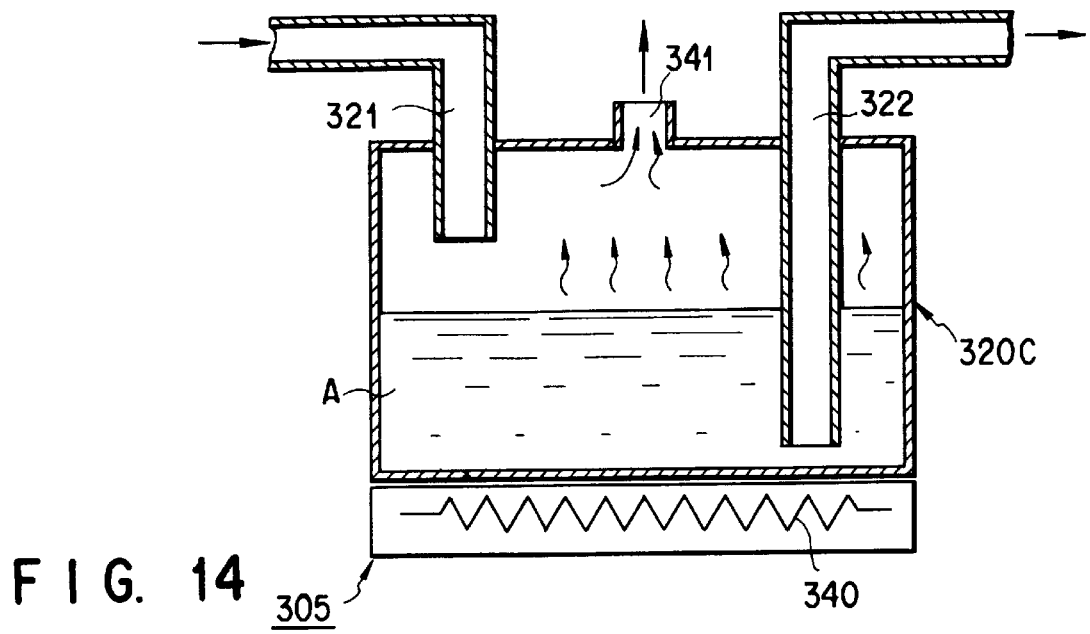
FIG. 14 is a schematic view showing another modification of the closed vessel shown in FIG. 12.

Furthermore, as shown in FIG. 14, a heating means such as a heater 340 can be arranged, instead of the ultrasonic generating device 330, adjacent to the bottom surface of a vessel 320C having an inlet 321 and an outlet 322 for the resist solution A. This heater 340 heats the resist solution A in the vessel 320C and evaporates the thinner contained in the resist solution A. In this structure, the vessel 320C is preferably a closed vessel. If a closed vessel is used, however, an exhaust port 341 for exhausting the evaporated thinner must be formed in the top wall of the vessel 320C.

The resist solution A is heated by the heater 340. However, the temperature of the resist solution A is adjusted to a predetermined temperature, e.g., 23° C., by the temperature adjusting mechanism 306 before the resist solution A reaches the resist solution supply nozzle 302 shown in FIG. 10. Therefore, the temperature of the resist solution A does not interfere with the operation.

A wafer transfer operation when the wafer W is subjected to a series of processing steps in the resist solution coating-developing system shown in FIG. 9 will be described below. First, in the cassette station 210 the wafer transfer forceps 212 accesses a cassette 211a storing unprocessed wafers W and unloads one wafer W from the cassette 211a. The wafer transfer forceps 212 moves the wafer W to the transfer table 213 and places the wafer W on the transfer table 213. The wafer W is subjected to orientation flat alignment and centering on the transfer table 213. Thereafter, the wafer transfer arm 242 of the main wafer transfer mechanism 240 accesses the transfer table 213 from the opposite side and receives the wafer W from the transfer table 213.

Figure 15:
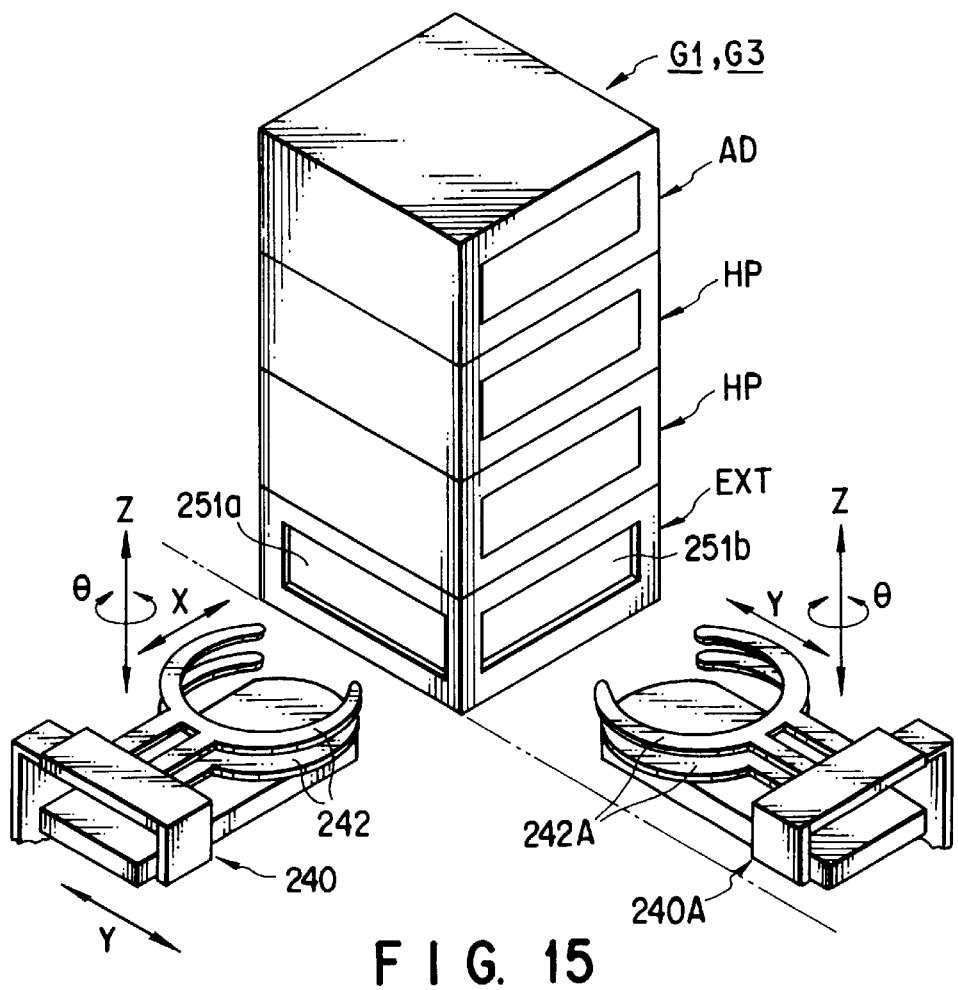
FIG. 15 is a perspective view showing the main parts of a first processor 250 of the resist solution coating-developing system shown in FIG. 9.

In the first processor 250, the main wafer transfer mechanism 240 loads the wafer W onto a table (not shown) through the gateway 51a of the extension unit (EXT) belonging to the first processing unit group G1. As shown in FIG. 15, the wafer transfer arm 242A of the auxiliary wafer transfer mechanism 240A of the first processor 250 accesses the other gateway 251b of the extension unit (EXT), receives the wafer W from the extension unit (EXT), and loads the wafer W into the adhesion unit (AD) belonging to the first processing unit group G1. In this adhesion unit (AD), the wafer W is subjected to adhesion processing. When the adhesion processing is completed, the auxiliary wafer transfer mechanism 240A unloads the wafer W from the adhesion unit (AD) and loads the wafer W into the cooling unit (COL) belonging to the second processing unit group G2. In this cooling unit (COL), the wafer W is cooled to a set temperature, e.g., 23° C., before resist coating processing. When the cooling processing is completed, the wafer transfer arm 242A of the auxiliary wafer transfer mechanism 240A unloads the wafer W from the cooling unit (COL) and loads the wafer W into the extension unit (EXT) belonging to the first processing unit group G1.

The wafer W loaded into the extension unit (EXT) is unloaded by the wafer transfer arm 242 of the main wafer transfer mechanism 240 and loaded into the resist coating apparatus 221 shown in FIG. 10. In this resist coating apparatus 221, the resist solution A having a predetermined viscosity adjusted by the viscosity adjusting means described above is supplied from the resist solution supply nozzle 302 onto the surface of the wafer W, and a resist film having a uniform film thickness is formed on the wafer surface by spin coating.

When the resist coating processing is completed, the main wafer transfer mechanism 240 unloads the wafer W from the resist coating apparatus 221 and again loads the wafer W into the extension unit (EXT) belonging to the first processing unit group G1. Thereafter, the wafer W is received by the auxiliary wafer transfer mechanism 240A and loaded into the baking unit (HP) belonging to the first or second processing unit group G1 or G2. In the baking unit (HP), the wafer W is placed on a hot plate (not shown) and heated to a predetermined temperature, e.g., 100° C., for a predetermined time. Consequently, the residual solvent is removed by evaporation from the coating film on the wafer W. When this pre-baking is completed, the auxiliary wafer transfer mechanism 240A unloads the wafer W from the baking unit (HP) and loads the wafer W into the cooling unit (COL) belonging to the second processing unit group G2. In this cooling unit (COL), the wafer W is cooled to a temperature, e.g., 24° C., suited to the subsequent step, i.e., edge exposure processing performed in an edge exposure unit (not shown). After this cooling, the auxiliary wafer transfer mechanism 240A transfers the wafer W to the extension unit (EXT) and places the wafer W on a table (not shown) in the extension unit (EXT). When the wafer W is placed on the table in the extension unit (EXT), the wafer transfer arm 242 of the main wafer transfer mechanism 240 accesses from the other gateway and receives the wafer W. The wafer transfer arm 242 loads the wafer W into the edge exposure unit in an interface unit (not shown) where the edge of the wafer W is exposed. When the edge exposure is completed, the wafer transfer arm 242 unloads the wafer W from the edge exposure unit and transfers the wafer W to a wafer receiving table (not shown) of an adjacent exposure unit (not shown).

When the entire surface of the wafer W is exposed in the exposure unit (not shown) and the wafer W is returned to the wafer receiving table of the exposure unit, the wafer transfer arm 242 of the main wafer transfer mechanism 240 accesses the wafer receiving table and receives the wafer W. The wafer transfer arm 242 loads the received wafer W into the developing unit 231. In this developing unit 231, the wafer W is placed on a spin chuck (not shown), and a developer is evenly poured on the resist on the wafer surface by, e.g., spraying. After the development, a rinsing solution is poured on the wafer surface to wash away the developer.

When the development step is completed, the main wafer transfer mechanism 240 unloads the wafer W from the developing unit 231, loads the wafer W through the gateway 251a of the extension unit (EXT) belonging to the third processing unit group G3, and places the wafer W on a table. The auxiliary wafer transfer mechanism 240A of the second processor 250A accesses the other gateway 251b of the extension unit (EXT), receives the wafer W from the extension unit (EXT), and loads the wafer W into the baking unit (HP) belonging to the third or fourth processing unit group G3 or G4. In this baking unit (HP), the wafer W is heated to, e.g., 100° C. for a predetermined time. Consequently, the resist swollen by the development is cured and this improves the chemical resistance.

After the baking, the auxiliary wafer transfer mechanism 240A unloads the wafer W from the baking unit (HP) and loads the wafer W into one of the cooling units (COL). After the wafer W returns to room temperature, the auxiliary wafer transfer mechanism 240A transfers the wafer W to the extension unit (EXT) belonging to the third processing unit group G3 and places the wafer W on a table from the gateway 251b. When the wafer W is placed on the table in the extension unit (EXT), the wafer transfer arm 242 of the main wafer transfer mechanism 240 accesses from the gateway 251a and receives the wafer W. The wafer transfer arm 242 transfers the received wafer W onto the transfer table 213 of the cassette station 210. The wafer transfer forceps 212 of the cassette station 210 accesses to receive the wafer W and loads the wafer W into a predetermined wafer storage groove in a cassette 211b for storing processed wafers. In this way the processing is completed.

In the resist coating apparatus 221 according to the second embodiment described above, the high-viscosity adjusting unit 305 is provided as a viscosity adjusting means in the supply pipe line 303 which supplies the resist solution A from the resist tank 304 to the resist solution supply nozzle 302. Since this high-viscosity adjusting unit 305 adjusts the viscosity of the single resist solution A, the resist solution A having an arbitrary viscosity can be dropped from the resist solution supply nozzle 302 onto the surface of the wafer W. Consequently, a resist film having an arbitrary film thickness can be formed on the surface of the wafer W without changing the rotating speed of the wafer W and by using the single resist solution A. Since it is unnecessary to prepare a plurality of resist solutions different in viscosity, the resist solution storage space can be decreased. Additionally, it is not necessary to change a plurality of resist solutions, so the maintenance of the resist coating apparatus 221 is facilitated. As a consequence, the throughput of the whole system is improved.

Furthermore, in the resist coating apparatus 221 according to the second embodiment, even when the wafer W with a large diameter of, e.g., 8" or 12" is rotated at a low speed in forming a film of a coating solution such as a resist solution on the wafer W, a resist film having a uniform film thickness can be formed on the surface of the wafer W because the resist coating apparatus 221 supplies the resist solution whose viscosity is adjusted to be suited to the rotating speed. Since the wafer W need not be rotated at a high speed, it is possible to prevent unevenness of the resist film on the edge of the wafer W, and this improves the yield.

Also, in the resist solution coating-developing system 300 according to the second embodiment, the main wafer transfer mechanism 240 and the auxiliary wafer transfer mechanism 240A share the wafer transfer operation, and this shortens the access time. Consequently, the processing time of the whole procedure is significantly reduced and this greatly improves the throughput. In addition, the gateways 251a and 251b of the extension unit (EXT) are individually formed on the sides of the main wafer transfer mechanism 240 and the auxiliary wafer transfer mechanism 240A. This prevents particles produced when the auxiliary wafer transfer mechanism 240A moves in the processors 250 and 250A from being carried to the main wafer transfer mechanism 240. Consequently, the wafer W processed in the coating processor 220 or the development processor 230 is less damaged by particles, and this also improves the throughput.

FIG. 16 is a schematic view showing a resist coating apparatus 221A of the third embodiment as the film forming apparatus according to the second invention of the present application. In the resist coating apparatus according to the second embodiment described above, the viscosity adjusting means is formed by the high-viscosity adjusting unit 305. In the resist coating apparatus 221A according to the third embodiment, as shown in FIG. 16, a low-viscosity adjusting unit 400, instead of the high-viscosity adjusting unit 305, is arranged in the middle of a supply pipe line 303. This low-viscosity adjusting unit 400 dilutes a resist solution A contained in a resist tank 304 and having a relatively high viscosity and supplies the resist solution A having a predetermined viscosity from a nozzle 302. As shown in FIG. 16, this low-viscosity adjusting unit 400 is formed by connecting a thinner tank 403 to the upper portion of an adjusting tank 401, which is provided in the middle of the supply pipe line 303, via an adjusting valve 402. As in the case shown in FIG. 10, the low-viscosity adjusting unit 400 operates the adjusting valve 402 in accordance with a signal from a CPU 309 which operates on the basis of a sensing signal from a viscosity sensor 310, and supplies a thinner to the adjusting tank 401, thereby adjusting the viscosity of the resist solution A.

When a resist solution A having a viscosity of 15 cp is contained in the resist tank 304 and a resist solution A having a lower viscosity than that of the resist solution A contained in the tank 304 is to be supplied, the low-viscosity adjusting unit 400 is operated to replenish the thinner to the resist solution A flowing through the supply pipe line 303 and contained in a vessel 320C, thereby obtaining the resist solution A having the predetermined viscosity.

Note that the same reference numerals as in the resist coating apparatus 221 of the second embodiment denote the same parts in the resist coating apparatus 221A of the third embodiment shown in FIG. 16, and a detailed description thereof will be omitted.

It is also possible to adjust the viscosity of the resist solution A over a broader range by combining the viscosity adjusting means of the second and third embodiments, i.e., the high-viscosity adjusting unit 305 and the low-viscosity adjusting unit 400. FIG. 17 is a schematic view showing a resist coating apparatus 221B according to the fourth embodiment as the film forming apparatus according to the second invention of the present application. As shown in FIG. 17, a high-viscosity adjusting unit 305 and a low-viscosity adjusting unit 400 described above are arranged parallel to a supply pipe line 303 via a switching valve 410. In accordance with a signal from a CPU 309 which operates on the basis of a sensing signal from a viscosity sensor 310, the switching valve 410 is switched and the high-viscosity adjusting unit 305 and the low-viscosity adjusting unit 400 are selectively operated to set a resist solution A to a predetermined viscosity. For example, when a resist solution A having a viscosity of 10 cp is contained in a resist tank 304 and a resist solution A having a higher viscosity than that of the resist solution A contained in the tank 304 is to be supplied, the switching valve 410 is switched to the high-viscosity adjusting unit 305. At the same time, the high-viscosity adjusting unit 305 is operated to reduce the thinner in the resist solution. Consequently, the resist solution with the predetermined high viscosity can be obtained.

On the other hand, to supply a resist solution A having a lower viscosity than that of the resist solution A contained in the resist tank 304, the switching valve 410 is switched to the low-viscosity adjusting unit 400. Simultaneously, the low-viscosity adjusting unit 400 is operated to replenish the thinner to the resist solution. Consequently, the resist solution with the predetermined low viscosity can be obtained.

Note that the same reference numerals as in the resist coating apparatuses 221 and 221A of the second and third embodiments denote the same parts in the resist coating apparatus 221B of the fourth embodiment shown in FIG. 17, and a detailed description thereof will be omitted.

In the second to fourth embodiments described above, the second invention of the present application is applied to a semiconductor wafer coating-developing system. However, the film forming apparatus according to the second invention of the present application can also be applied to a system in which a resist film is formed by coating an object to be processed other than a semiconductor wafer, e.g., an LCD substrate, a glass substrate, a CD substrate, a photomask, a printed substrate, or a ceramic substrate, with a resist solution. The second invention of the present application is also applicable to a system in which a solution film with a uniform film thickness is formed by coating the surface of an object to be processed with various processing solutions other than a resist solution, e.g., a developing solution and a cleaning solution.

The first and second inventions of the present application described above can be combined. For example, in the resist coating apparatus 110 according to the first embodiment shown in FIG. 3, it is possible to use the resist solution supply system in the resist coating apparatus 221 according to the second embodiment shown in FIG. 10, which extends from the resist tank 304 to the resist solution supply nozzle 302 and includes, e.g., the high-viscosity adjusting unit 305 as a viscosity adjusting means and the CPU 309, instead of the resist solution supply system extending from the resist solution supply source 126 to the resist solution supply nozzle 121 through the resist solution supply passage 119.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming method comprising the steps of:
   (a) holding a substrate to be processed, rotatably, with a spin chuck in a container;
   (b) starting to supply a mist-form solvent to a space above the substrate;
   (c) supplying a processing solution including a solvent onto an upper surface of the substrate, after step (b);
   (d) forming a closed processing space surrounding the substrate by closing a container, and rotating the substrate in the closed processing space while the closed processing space is filled with the mist-form solvent to disperse the processing solution by centrifugal force to form a film of the processing solution over the entire upper surface of the substrate; and
   (e) stopping the supply of the mist-form solvent to the closed processing space, and supplying air to the closed processing space to air-purge the closed processing space.

2. A method according to claim 1, further comprising the steps of:
   supplying the solvent onto the upper surface of the substrate before step (b); and
   rotating the substrate to disperse the solvent to form a film of the solvent on the upper surface of the substrate.

3. A method according to claim 1, further comprising the steps of:
   supplying the solvent on the upper surface of the substrate between steps (b) and (c); and
   rotating the substrate to disperse the solvent to form a film of the solvent on the upper surface of the substrate.

4. A method according to claim 1, further comprising the step of:
   adjusting the temperature and humidity of air to be supplied to the closed processing space to generate dry air;

wherein step (e) comprises:

supplying the dry air to the closed processing space.

5. A method according to claim 1, further comprising the step of:

connecting a flow path having an open/close valve to the container;

wherein step (e) comprises:

opening the valve to discharge the mist-form solvent from the closed processing space via the flow path.

6. A method according to claim 5, wherein step (e) further comprises:

circulating the mist-form solvent discharged from the closed processing space back into the closed processing space via the flow path.

7. A method according to claim 1, further comprising the step of:

opening the closed processing space to unload the substrate from the container after step (e).

8. A method according to claim 1, further comprising the step of:

spraying an inert gas into a liquid solvent to generate the mist-form solvent used in step (b).

9. A method according to claim 8, further comprising the step of:

carrying the generated mist-form solvent to the container with a carrier gas.

10. A film forming method comprising the steps of:

(A) holding a substrate, rotatably, with a spin chuck in a container;

(B) supplying a processing solution including a solvent onto an upper surface of the substrate;

(C) starting to supply a mist-form solvent to a space above the substrate, after step (B);

(D) forming a closed processing space surrounding the substrate by closing a container, and rotating the substrate in the closed processing space while the closed processing space is filled with the mist-form solvent to disperse the processing solution by centrifugal force to form a film of the processing solution over an entire upper surface of the substrate; and (E) stopping the supply of the mist-form solvent to the closed processing space, and supplying air to the closed processing space to air-purge the closed processing space.

11. A method according to claim 10, further comprising the steps of:

supplying the solvent onto the upper surface of the substrate before step (B), and rotating the substrate to disperse the solvent to form a film of the solvent on the upper surface of the substrate.

12. A method according to claim 10, further comprising the step of:

adjusting the temperature and humidity of air to be supplied to the closed processing space to generate dry air;

wherein step (E) comprises:

supplying the dry air to the closed processing space.

13. A method according to claim 10, further comprising the step of:

connecting a flow path having an open/close valve to the container;

wherein step (E) comprises:

opening the valve to discharge the mist-form solvent from the closed processing space via the flow path.

14. A method according to claim 13, wherein step (E) further comprises the step of:

circulating the mist-form solvent discharged from the closed processing space back into the closed processing space via the flow path.

15. A method according to claim 10, further comprising the step of:

opening the closed processing space to unload the substrate from the container after step (E).

16. A method according to claim 10, further comprising the step of:

spraying an inert gas into a liquid solvent to generate the mist-form solvent used in step (C).

17. A method according to claim 16, further comprising the step of:

carrying the generated mist-form solvent to the container with a carrier gas.

* * * * *